(12) United States Patent
Natura et al.

(10) Patent No.: US 7,873,084 B2
(45) Date of Patent: Jan. 18, 2011

(54) ARRANGEMENT AND METHOD FOR PREVENTING THE DEPOLARIZATION OF LINEAR-POLARIZED LIGHT DURING THE TRANSMISSION OF LIGHT THROUGH CRYSTALS

(75) Inventors: Ute Natura, Jena (DE); Martin Letz, Mainz (DE); Lutz Parthier, Kleinmachnow (DE)

(73) Assignee: Hellma Materials GmbH & Co. KG, Jena (DE)

( * ) Notice: Subject to any disclaimer, the term of this patent is extended or adjusted under 35 U.S.C. 154(b) by 474 days.

(21) Appl. No.: 11/874,570

(22) Filed: Oct. 18, 2007

(65) Prior Publication Data

US 2008/0094701 A1 Apr. 24, 2008

(30) Foreign Application Priority Data

Oct. 23, 2006 (DE) ........................ 10 2006 049 846

(51) Int. Cl.
*H01S 3/13* (2006.01)
*H01S 3/08* (2006.01)

(52) U.S. Cl. ........................................ 372/27; 372/103

(58) Field of Classification Search ................... 372/27, 372/103; 359/483, 487
See application file for complete search history.

(56) References Cited

U.S. PATENT DOCUMENTS

| | | | |
|---|---|---|---|
| 5,851,284 A | 12/1998 | Ishibashi et al. | |
| 6,556,613 B2 * | 4/2003 | Kleinschmidt et al. | ...... 372/103 |
| 6,785,319 B1 | 8/2004 | Ariga et al. | |
| 7,217,585 B1 * | 5/2007 | Sumida et al. | ................ 438/31 |

(Continued)

FOREIGN PATENT DOCUMENTS

EP 1478061 11/2004

(Continued)

OTHER PUBLICATIONS

M. Letz et al:"Spatial Dispersion in CAF2 Caused by the Vicinity of an Excitonic Bound State". Schott Glas, Research amd Development, ARXIV:COND-MAT/0204282 V1 , Apr. 12, 2002.

(Continued)

*Primary Examiner*—Minsun Harvey
*Assistant Examiner*—Phillip Nguyen
(74) *Attorney, Agent, or Firm*—Michael J. Striker

(57) ABSTRACT

A process and a device is described to avoid the depolarization of linear-polarized light during the transmission of light through crystals exhibiting a {111} or {100} crystal plane, respectively, and a <100> or <111> crystal axis, respectively. The device is characterized in that the linear-polarized light meets the surface of the crystals in an angle of 45-75°, whereby the surface is formed by the {111} or the {100} plane. The crystal is arranged in such a way that upon entering the crystal, the light spreads along the <100> or <111> crystal axis, respectively, as parallel as possible, and/or that the device comprises a unit for temperature equalization to avoid a thermal gradient in the crystal. Preferably the device is used in DUV lithography, in particular in steppers and excimer lasers, as well as for the production of integrated circuits, computer chips as well as electronic devices such as computers, and other devices that comprise chip-type integrated circuits, as well as for flat screens.

19 Claims, 12 Drawing Sheets

DISPOSITION OF A WINDOW (SAMPLE 6) AT A BREWSTER ANGLE TO THE DIRECTION OF THE LASER BEAM DIRECTION WITH APPLICATION OF A TEMPERATURE GRADIENT ALONG THE <111> CRYSTAL AXIS (BREWSTER ANGLE: 56.34°/OPENING ANGLE 33.66°)

U.S. PATENT DOCUMENTS

| | | |
|---|---|---|
| 2003/0072342 A1 | 4/2003 | Yoshida et al. |
| 2003/0231687 A1 | 12/2003 | Wakabayashi et al. |
| 2004/0257565 A1* | 12/2004 | Ishihara .................. 356/364 |
| 2005/0058165 A1* | 3/2005 | Morehead et al. ............ 372/39 |
| 2005/0117085 A1* | 6/2005 | Taira et al. .................. 349/56 |
| 2005/0163173 A1* | 7/2005 | Reid et al. .................. 372/21 |

FOREIGN PATENT DOCUMENTS

| | | |
|---|---|---|
| JP | 61-42181 | 2/1986 |
| JP | 2-288383 | 11/1990 |
| JP | 2006-73921 | 3/2006 |
| WO | 02/093201 | 11/2002 |
| WO | 03/096497 | 11/2003 |

OTHER PUBLICATIONS

John H. Burnett, et al: "Intrinsic Birefringence in Calcium Fluoride and Barium Fluoride." Physical Review B, vol. 64, 241102(R).

* cited by examiner a) ARRANGEMENT OF THE SAMPLE IN THE RADIATION BEAM (x, y = LABORATORY SYSTEM/x', y' = CRYSTAL SYSTEM)
   $\alpha$ = ANGLE BETWEEN THE CRYSTAL SYSTEM AND THE LABORATORY SYSTEM,
   $\beta_0$ = ANGLE OF ROTATION ABOUT THE IRRADIATION CHANNEL FOR THE SAMPLE IN THE LABORATORY SYSTEM b) MEASUREMENT OF THE DEPOLARIZATION FOR SAMPLE 1 ($\beta_0=60°$)

DEPOLARIZATION AS A FUNCTION OF $\beta_0$ FOR SAMPLES 1 – 4 (SAMPLE LENGTH IN RADIATION BEAM = 100 mm)

ARRANGEMENT OF THE SAMPLE IN THE RADIATION BEAM WITH SIMULTANEOUS APPLICATION OF A TEMPERATURE GRADIENT

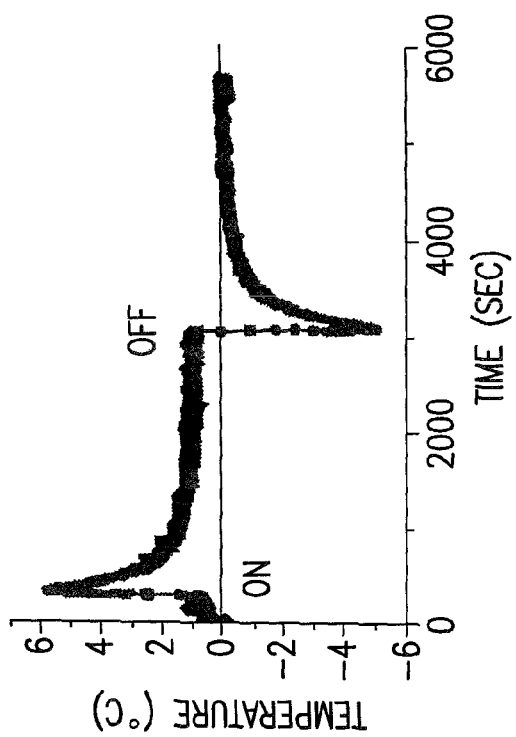
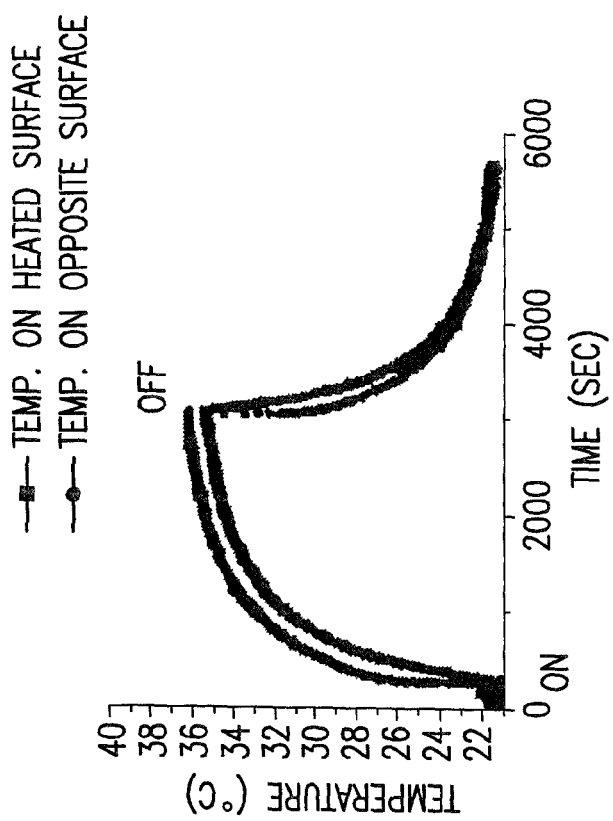
FIG.4A
FIG.4B
A) TEMPERATURE VARIATION OF THE HEATED SURFACE AND OF THE OPPOSITE SURFACE (DISTANCE BETWEEN THE SURFACES = 25 mm) WHEN THE PELTIER ELEMENT IS TURNED ON AND OFF.
B) TEMPERATURE GRADIENT AS SHOWN IN A DEPOLARIZATION FOR A) SAMPLE 2, B) SAMPLE 3 AND C) SAMPLE 1 ($\beta_0=0°$) UPON APPLICATION OF A TEMPERATURE GRADIENT CORRESPONDING TO THE VARIATION SHOWN IN FIG.3
(POL. LASERB. = DIRECTION OF POLARIZATION OF THE LASER RADIATION)

SETTING THE TEMPERATURE GRADIENT PERPENDICULAR (A AND B) OR PARALLEL (C) TO THE DIRECTION OF THE BEAM

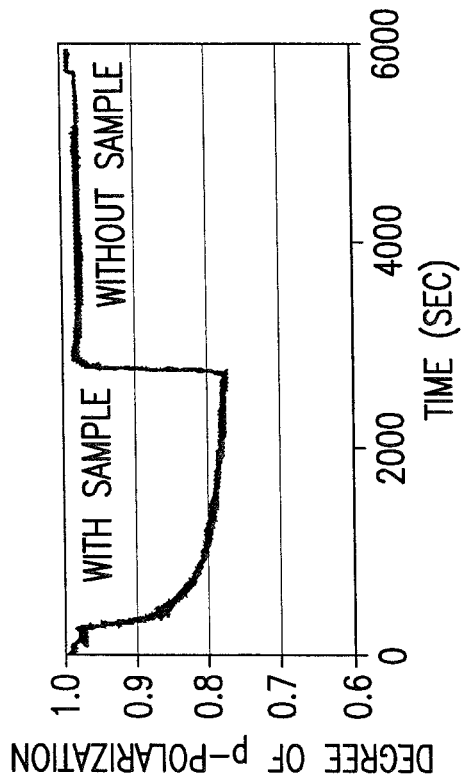
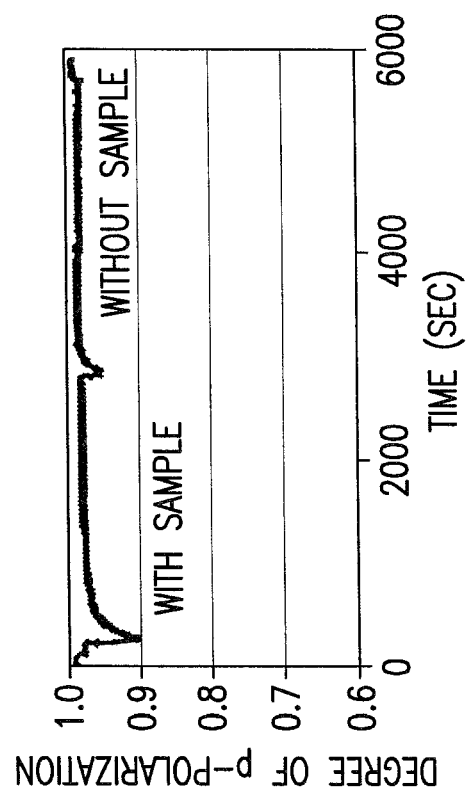
FIG.7A
FIG.7B
DEPOLARIZATION UPON APPLICATION OF A T-GRADIENT TO SAMPLE 5.
(SAMPLE LENGTH IN THE LIGHT PATH: 25 mm)
(A) PERPENDICULAR TO THE DIRECTION OF THE BEAM (ARRANGEMENT OF FIG.6A)
(B) PARALLEL TO THE DIRECTION OF THE BEAM (ARRANGEMENT OF FIG.6C)

DISPOSITION OF A WINDOW (SAMPLE 6) AT A BREWSTER ANGLE TO THE DIRECTION OF THE LASER BEAM DIRECTION WITH APPLICATION OF A TEMPERATURE GRADIENT ALONG THE <111> CRYSTAL AXIS (BREWSTER ANGLE: 56.34°/OPENING ANGLE 33.66°)

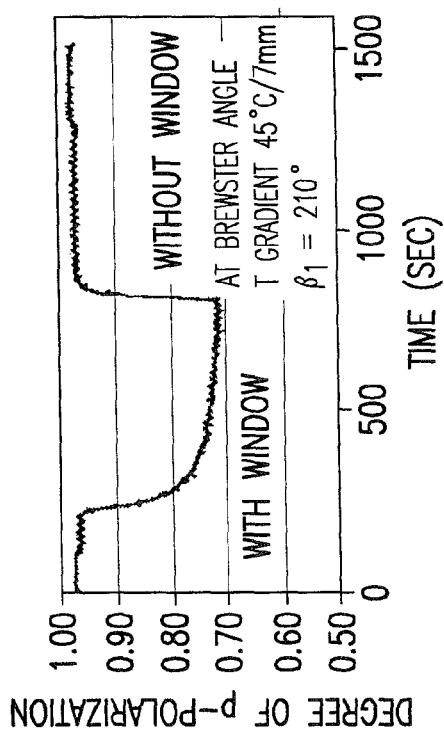

DEPOLARIZATION THROUGH LASER WINDOW (SAMPLE 6 / SAMPLE LENGTH IN RADIATION BEAM = 8.4 mm) WHICH IS DISPOSED AT THE BREWSTER ANGLE TO THE DIRECTION OF THE LASER RADIATION, WHEN A TEMPERATURE GRADIENT IS APPLIED ALONG THE <111> CRYSTAL AXIS WITH VARIATION OF THE $\beta_1$ ANGLE:

A) $\beta_1 = 210°$ / MAX. T GRADIENT 45°C/7 mm
B) $\beta_1 = 210°$ / MAX. T GRADIENT 20°C/7 mm
C) $\beta_1 = 270°$ / MAX. T GRADIENT 45°C/7 mm
D) $\beta_1 = 270°$ / MAX. T GRADIENT 20°C/7 mm

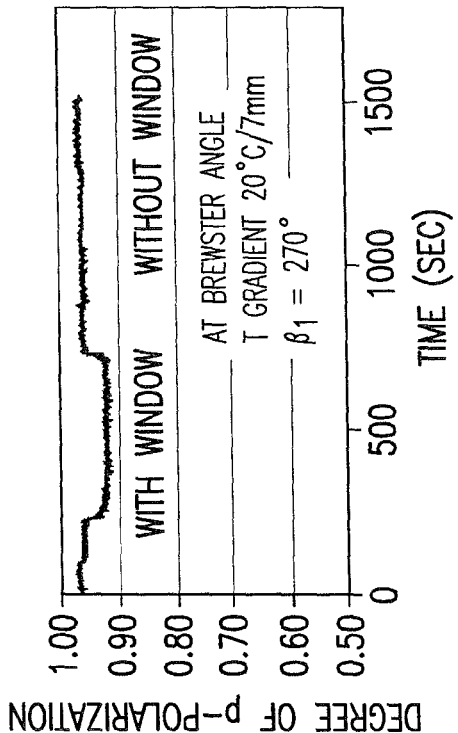

FIG.9C

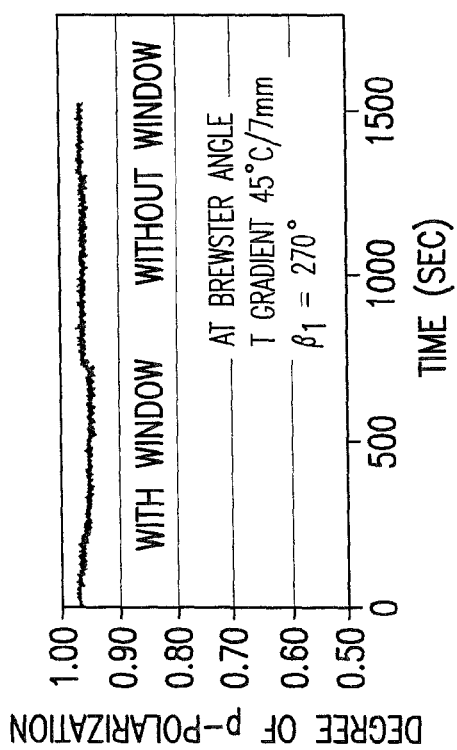

FIG.9D

DEPOLARIZATION THROUGH LASER WINDOW (SAMPLE 6 / SAMPLE LENGTH IN RADIATION BEAM = 8.4 mm) WHICH IS DISPOSED AT THE BREWSTER ANGLE TO THE DIRECTION OF THE LASER RADIATION, WHEN A TEMPERATURE GRADIENT IS APPLIED ALONG THE <111> CRYSTAL AXIS WITH VARIATION OF THE $\beta_0$ ANGLE:

A) $\beta_1 = 210°$ / MAX. T GRADIENT 45°C/7 mm
B) $\beta_1 = 210°$ / MAX. T GRADIENT 20°C/7 mm
C) $\beta_1 = 270°$ / MAX. T GRADIENT 45°C/7 mm
D) $\beta_1 = 270°$ / MAX. T GRADIENT 20°C/7 mm DEPOLARIZATION THROUGH LASER WINDOW (SAMPLE 6) WHICH IS DISPOSED AT A BREWSTER ANGLE TO THE DIRECTION OF THE LASER RADIATION WHEN A TEMPERATURE GRADIENT IS APPLIED ALONG THE <111> CRYSTAL AXIS AS A FUNCTION OF THE $\beta_1$ ANGLE.

PROJECTION OF THE DIRECTION OF THE LASER BEAM IN THE CRYSTAL DURING IRRADIATION AT THE BREWSTER ANGLE (OPENING ANGLE 33.7°) ONTO THE COORDINATES (A) <100>, (B) <010> AND (C) <001> AS A FUNCTION OF THE $\beta_1$ ANGLE.

ARRANGEMENT AND METHOD FOR PREVENTING THE DEPOLARIZATION OF LINEAR-POLARIZED LIGHT DURING THE TRANSMISSION OF LIGHT THROUGH CRYSTALS

BACKGROUND OF THE INVENTION

1. The Field of the Invention

The invention relates to an arrangement and a method for preventing or reducing the de-polarization of linear-polarized light during the transmission of light through an optical medium, particularly through crystals. The invention also relates to the use of such an arrangement.

2. The Description of the Related Art

Linear-polarized light is an electromagnetic transversely propagating wave that vibrates only in a plane transversal to the direction of propagation. If additionally the light is also coherent, all waves propagate synchronously. The light beam thus consists of a bundle of such individual, equally oriented waves. Linear-polarized light finds use in a wide area of technology, for example in the production of computer chips or flat-panel displays and TFT monitors. When linear-polarized light impinges on a polarizing filter which transmits only light vibrating in a certain plane, then depending on its position relative to the plane of vibration of a polarized light beam said filter is either permeable in unhindered manner or impermeable (vertical and horizontal setting). The generation of polarized light has been known for a very long time and is brought about, for example, by means of a birefringent crystal such as calcite ($CaCO_3$).

Another possible method for generating polarized light or a polarized radiation involves the reflection from a surface at a Brewster angle. If the light or the radiation beam is reflected at a Brewster angle and then refracted, the reflected beam is polarized entirely in the direction perpendicular to the plane of refraction or of reflection (s-polarization) and the transmitted beam contains without any reflection losses the entire radiation that is polarized parallel to the refraction plane or to the reflection plane (p-polarization) and some of the s-polarized radiation.

A device for utilizing this effect is, for example, a Nicols prism or a Brewster prism which redirects p-polarized radiation to the extent of 90° without losses. Other examples are laser windows disposed at a Brewster angle or prisms disposed at a Brewster angle which allow transmission of p-polarized radiation without reflection losses and only minor transmission for s-polarized radiation and can be used to create polarized light particularly, for example, for a laser, as described in U.S. Pat. No. 6,556,613. Another device for generating such polarized radiation is, for example, a laser. Laser radiation, particularly pulsating laser radiation, is characterized by the fact that, depending on the kind and arrangement of such a device, it is possible to generate not only coherent laser light but also polarized or unpolarized laser light. This, for example in an excimer laser for micro-lithography, occurs in that the optical components (for example the prisms and exit windows) are disposed at a Brewster angle to outcouple a polarization direction.

It has been known for a long time, however, that when linear-polarized laser light passes through an optical medium, for example through a lens or a prism etc, it loses part of its polarization, namely it becomes depolarized. Linear-polarized light thus gives rise to elliptically polarized light, or the direction of vibration is modified. This effect in itself is known.

In TFT technology the background light first passes through a vertically disposed polarizing filter and then through a variable polarizing filter the polarization direction of which can be changed from vertical to horizontal by applying an electric voltage. In this manner, the background light (horizontal orientation) can be fully blocked or (vertical orientation) fully transmitted. If in such a case, however, the polarized light is depolarized between the filters, the light can no longer be completely extinguished or it can no longer be fully transmitted through the filtering system, namely both the luminosity and the darkness undergo a loss in intensity.

Another major technical problem is the depolarization of polarized laser light. In the production of semiconductors and other electronic components in particular, such an effect leads to imaging inaccuracies. Thus, J. H. Burnett in Phys. Rev. B, vol. 64 (2001), 241102 (R), 1-4, has already described the intrinsic birefringence in calcium fluoride and barium fluoride crystals used, for example, for the afore-said production of electronic components. In other words, in such systems with purely cubic symmetry it is theoretically not to be expected that birefringence would occur, namely that direction-dependent differences in optical properties such as absorption and refractive index would arise. To pre-vent such depolarization-induced illumination problems in precision UV technology, it has been proposed (WO 02/093201 A2) to use differently oriented lens systems, namely a combination of two {111}-(perpendicular) oriented lenses that can be rotated through 60° relative to one another and two {100}-oriented lenses rotated through 45° relative to one another.

M. Letz et al. also describe in "Proceedings of SPIE", vol. 4691, pp. 1761-1768 (2002) the in itself surprising strain birefringence in purely cubic crystal systems such as $CaF_2$. They describe the correlation between the optical anisotropy and the dispersion of the gamma exciton. This correlation was demonstrated experimentally with the aid of synchrotron scattering (M. Letz et al., Phys. Rev. B, 67, 233101 (2003).

SUMMARY OF THE INVENTION

Hence, the object of the invention is to overcome the afore-said problems caused by de-polarization of linear-polarized light in optical systems such as laser devices, flat-panel displays and particularly in the production of electronic components etc. In particular, the object of the invention is not only to prevent the depolarization caused by the afore-described intrinsic effects but also the depolarization caused by strains induced by temperature gradients.

This objective is reached by way of the features defined in the claims.

In fact, according to the invention we have found that the depolarization of polarized light in optical elements is caused by the formation of a temperature gradient. This means that by preventing the formation of such a temperature gradient it is possible to prevent the depolarization of linear-polarized light. Preferably, the formation of a temperature gradient is prevented in all spatial directions. In particular, an embodiment of the invention prevents the formation of a temperature gradient when the temperature of the laser gas within the laser chamber deviates from the temperature prevailing outside the laser chamber. The external temperature is usually determined by the temperature of the purging gas.

According to the invention, we have also found that the depolarization of polarized light or radiation in a crystalline material can also be prevented when the light or the radiation impinges on a surface of the crystal or of the crystalline optical element formed by the {111}- or {100}-crystal plane. If then the crystal or the optical element is rotated in a manner such that the light in the crystal propagates along the <100>- or <111>-crystal axis, the depolarization during light transmission through the crystal is prevented or minimized. The light beam can impinge on the surface at any desired angle. In a preferred embodiment, the incident light beam forms with the surface an angle of 45-75°, the Brewster angle being particularly preferred.

In a preferred embodiment of the invention, the two effects are combined.

Crystal systems are described with the aid of two coordinate systems. The first system is the "direct simple Bravais lattice" generated by vectors forming the primary unit cell with the symmetry of the lattice. In the cubic calcium fluoride, for example, these are the unit vectors that link two directly adjacent F ions a1, a2, a3. In this coordinate system, special directions, for example the [1,1,0] direction, are indicated by square brackets. General directions, for example all directions equivalent to [1,1,0] ([1,1,0], [1,−1,0], [1,0,1], [1,0,−1], [0,1,1], [0,1,−1]) are indicated by pointed brackets < > namely as <1,1,0>.

The second coordinate system, the so-called reciprocal lattice, is generated by the vectors that are perpendicular to the plane generated by each two basic vectors of the "direct simple Bravais lattice". In the cubic crystal system such as calcium fluoride, these two coordinate systems are identical. The unit vectors of the reciprocal lattice, b1, b2, b3, point in the same direction as do the unit vectors of the "direct simple Bravais lattice", a1, a2, a3. In this case, to simplify generalization to noncubic lattices, a different notation is used. The vector perpendicular to a lattice plane in the coordinates of the reciprocal lattice is indicated by parentheses (h,k,l)=h b1+k b2+l b3, for example (1,1,1). The plane is then referred to as the (1,1,1) plane. The (h,k,l) indices are Miller indices. The totality of all planes equivalent to the (1,1,1) plane [(1,1,1), (−1,1,1), 1,−1,1), (1,1,−1)] is indicated by braces, namely as {1,1,1}. This means that in the cubic crystal the planes of the lattice with Miller indices (h,k,l) are oriented perpendicular to the crystal direction [h,k,l]. In the following, the crystal planes will be indicated by their Miller indices {h,k,l}.

The direction of propagation of electromagnetic radiation (here essentially the 193 nm laser radiation) is indicated by the wave vector k. The direction of propagation is indicated by an orientation in the crystal with <mno>.

According to the invention, the formation of a temperature gradient in the direction of light propagation, namely in the direction of the transversal light beam, is prevented by means of a tempering unit. Such a tempering unit can be either a cooling element or a heating element. Such elements are, for example, a Peltier element, a system for supplying a heated fluid, for example a gas and particularly air and/or a liquid, for example water or preferably an oil or a liquid that is inert toward the crystal and/or a heat radiator or heat absorber. If the element is tempered with a fluid, it is preferred to cool with said fluid only sites that are optically not needed or irradiated.

According to another preferred embodiment, the beam or the bundle of linear-polarized transversal waves is guided through the optical element centrally, namely as centrally as possible.

With the arrangement or method of the invention, it is also possible to prevent or markedly reduce the depolarization which to a increased degree takes place, in particular, at coated and polished laser windows.

In yet another preferred embodiment of the invention, the linear-polarized light is guided through an optical crystalline element. Such optical crystalline elements are, in particular, cubic crystal systems such as cubic garnets, cubic spinels, cubic perovskites and cubic M(II) oxides and M(IV) oxides. Suitable crystals are $Y_3Al_5O_{12}$, $Lu_3Al_5O_{12}$, $Ca_3Al_2Si_3O_{12}$, $K_2NaAlF_6$, $K_2NaScF_6$, $K_2NaAlF_8$ and/or $Na_3Al_2Li_3F_{12}$, $(Mg,Zn)Al_2O_4$, $CaAl_2O_4$, $CaB_2O_4$, $ZrO_2:Y_2O_3$ (Y=stabilized $ZrO_2$), $Y_2O_3$ and/or $LiAl_5O_8$ and $BaZrO_3$ and/or $CaCeO_3$. Other particularly suitable cubic crystals are the alkaline earth metal halides and alkali metal halides, particularly the chlorides or fluorides such as $CaF_2$, $BaF_2$, $SrF_2$, NaF, KF, CaF and mixed crystals thereof.

BRIEF DESCRIPTION OF THE DRAWING

The invention will be explained in greater detail by way of the following drawings and examples.

Among the drawings:

FIG. 4 shows the temperature variation at the heated surface and at the opposite surface when a heating element is turned on and off;

FIG. 7 shows the depolarization when a temperature gradient is applied perpendicular and parallel to the direction of the beam as shown in FIG. 6;

FIG. 9 shows the depolarization measured with an arrangement of FIG. 8.

DETAILED DESCRIPTION OF THE INVENTION

Five samples of $CaF_2$ crystals with a length of 100 mm were prepared, and a commercially available $CaF_2$ laser window with a [111] surface orientation and a thickness of 7 mm was used. The individual samples are indicated in Table 1.

TABLE 1

| Sample | d (in mm) | Orientation of Front Surfaces | Orientation of Side Surfaces |
|---|---|---|---|
| 1 | 100 | {110} | {001} and {1-10} |
| 2 | 100 | {100} | {001} and {1-11} |
| 3 | 100 | {111} | {11-2} and {1-10} |
| 4 | 100 | random | |
| 5 | 100 | random | polished on all sides |
| 6 Laser window | 7 | {111} | |

Figures 1A, 1B:
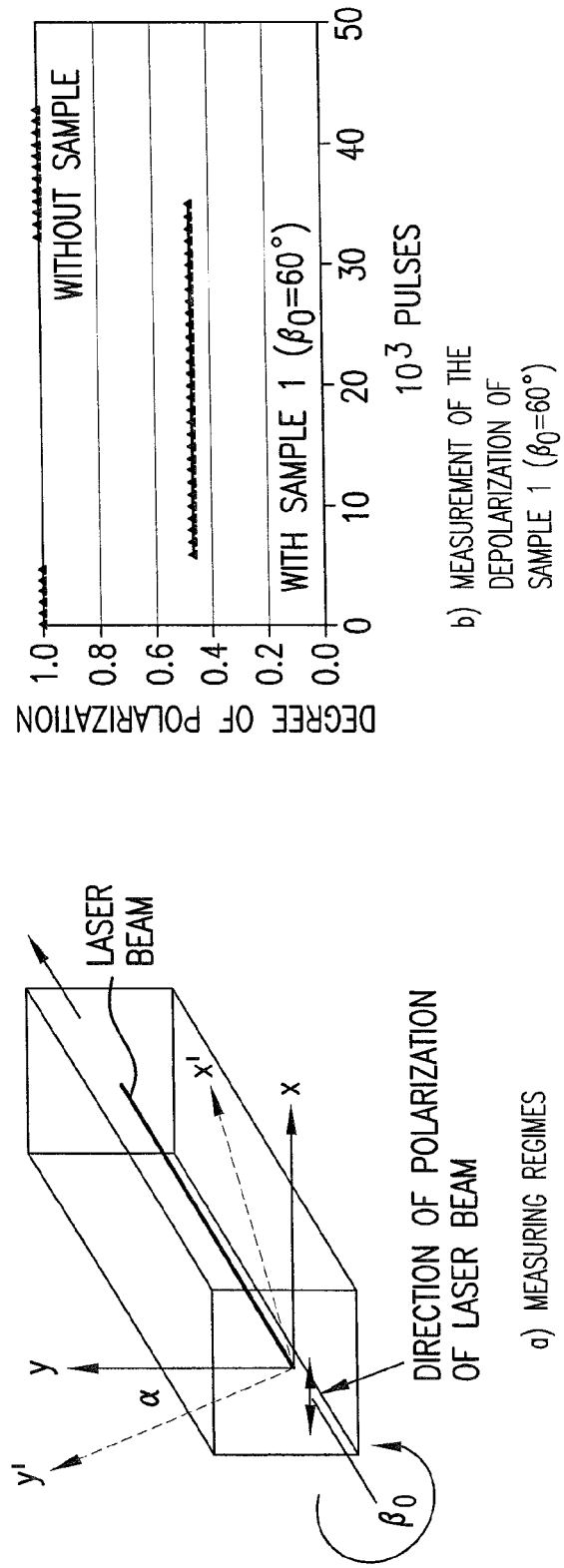
FIG. 1 shows the arrangement of a crystalline sample in the light path.

FIG. 1 shows an experimental arrangement for determining the degree of polarization of the radiation. Here, the depolarization of the laser beam was first determined without the sample and then the sample to be studied was placed into the light beam and the crystal was rotated through an angle $\beta_0$ relative to the direction of the beam taken as the axis of rotation. The angle α shown indicates the angle between the crystal system (crystal axes x', y') and the laboratory axes (x, y, light path).

Figure 2:
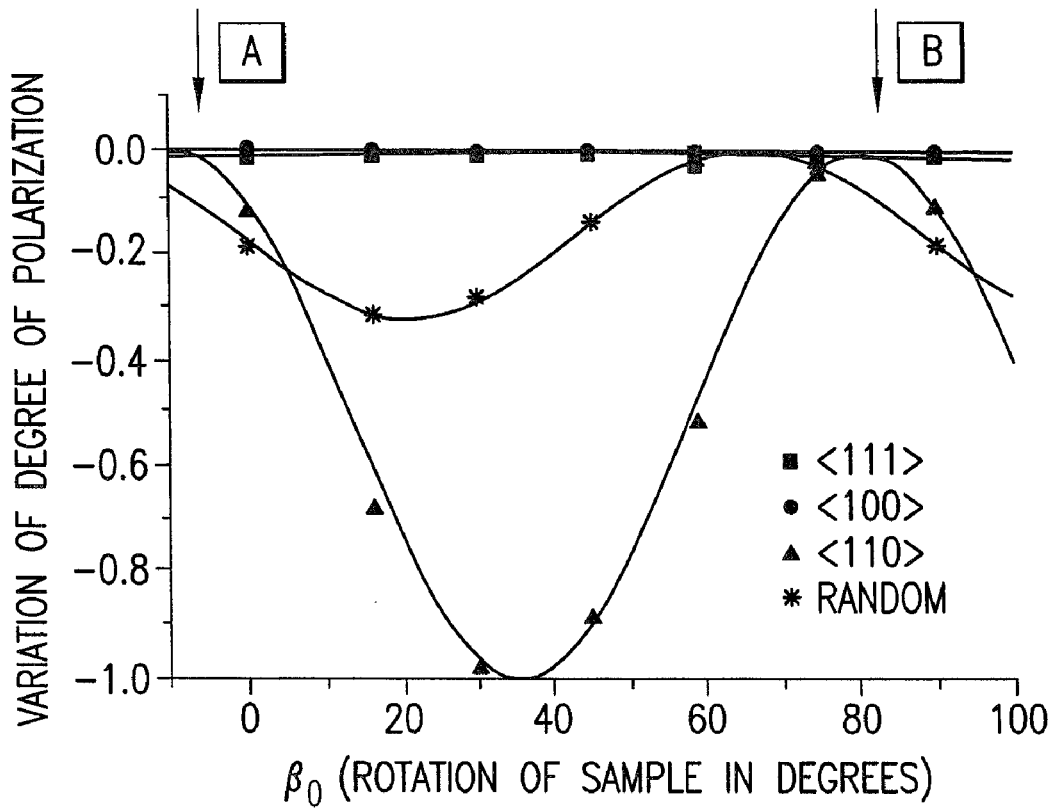
FIG. 2 shows the depolarization as a function of the rotation angle $\beta_0$ for various samples.

By means of the experimental arrangement shown in FIG. 1, the depolarization for the angle $\beta_0$ was then measured for different crystal orientations. The results are shown in FIG. 2. As can be seen, samples 2 and 3, namely the front surfaces {111} and {100} show the lowest depolarization, whereas the front surface {110} (sample 1) shows the highest depolarization. The randomly oriented sample 4 shows a depolarization intermediate between that of samples 2/3 and that of sample 1 when the laser radiation impinges on the front surface vertically. It can also be seen that the depolarization for all samples is lowest when the beam in the crystal propagates along the <100> or <111> crystal axis and that for irradiation along the <110> crystal axis and also randomly there exists an angle $\beta_0$ for which depolarization is minimal.

We have also found that the depolarization is independent of the repetition rate R and energy density H. The irradiations were carried out at R=100 Hz and H=7 mJ/cm$^2$. The total depolarization was equal to the phase displacement Pi/2 which at the 193-nm wavelength of the radiation corresponds to a delay of 48 nm or 4.8 nm/cm. The minimal depolarization for the <110>-oriented sample was achieved when the sample was placed into the radiation path so that the polarization direction of the laser beam lied in the crystal plane {001} (FIG. 2a) or {1-10} (FIG. 2b).

Figure 3:
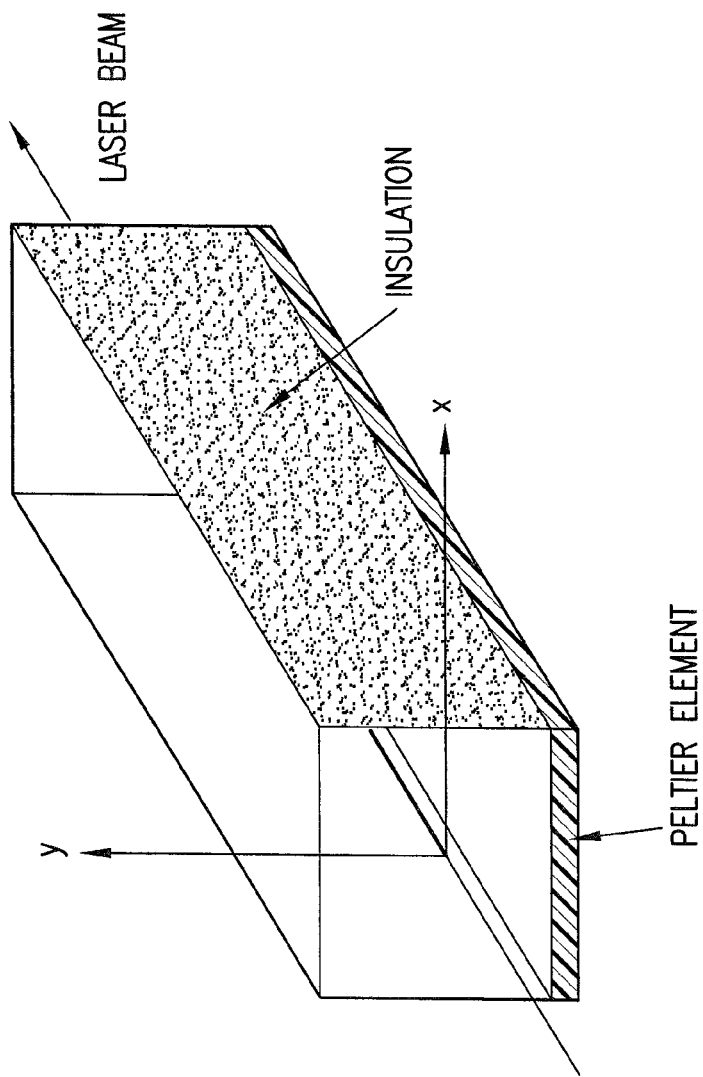
FIG. 3 shows an experimental arrangement for creating a temperature gradient.

FIG. 3 shows an arrangement for determining the effect of a temperature gradient perpendicular to the beam direction on the polarization. Here the laser beam is guided through the crystal sample perpendicular to the temperature gradient produced by a Peltier element. The results are presented in FIGS. 4a and 4b. FIG. 4a shows the temperature variation on a heated surface and on the opposite surface after the Peltier element has been turned on or off (distance between the two surfaces: 25 mm). The absolute temperature rise was about 14° C., and the temperature gradient (FIG. 4b) attained a maximum value of 5-6° C./25 mm shortly after the element was turned on or off. This maximum value subsides after a while, the gradient thus becoming smaller and finally assuming a nearly constant value.

Figure 5A:
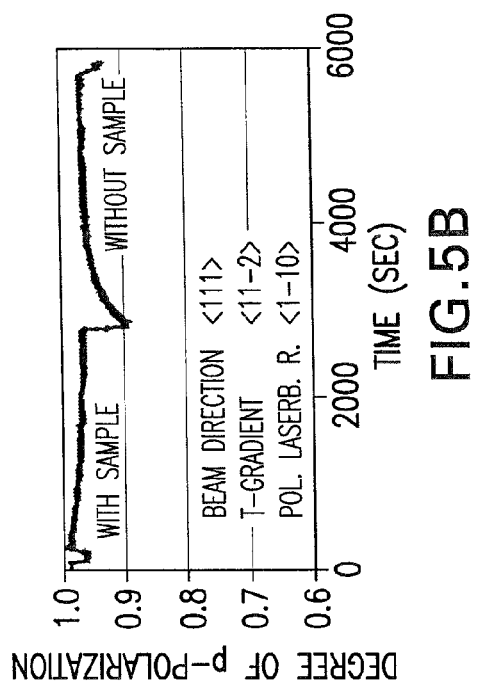
FIG. 5 shows the depolarization of a laser beam measured with the arrangement shown in FIG. 3.
Figure 5B:
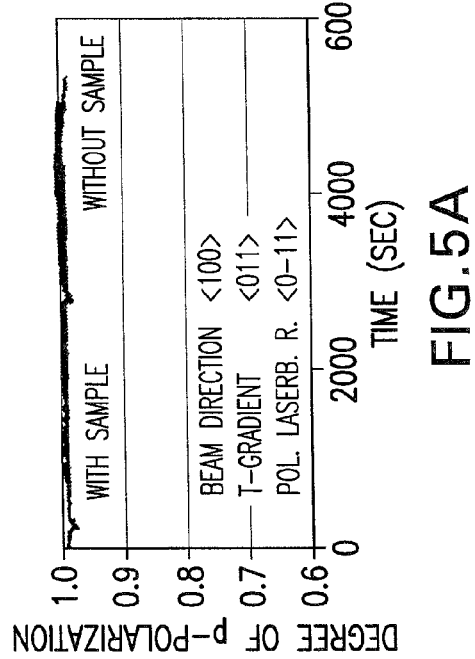
Figure 5C:
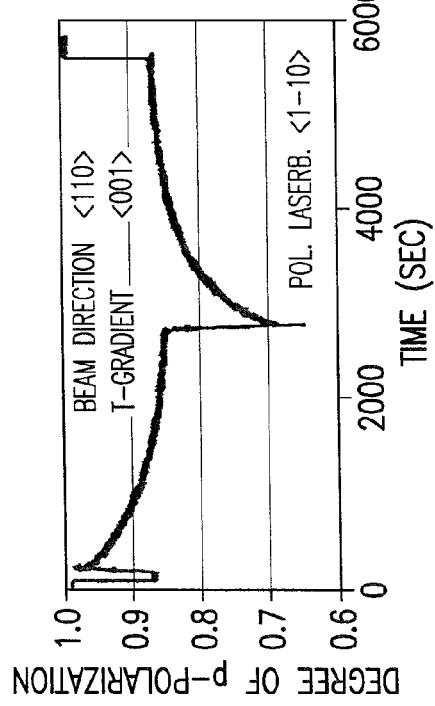

By means of the arrangement depicted in FIG. 4, the depolarization was studied as a function of crystal orientation relative to the beam direction and to the direction of the temperature gradient. The results are presented in FIG. 5. FIGS. 5a-c show the samples 2, 3 and 1 for the angle $\beta_0=0$ when a temperature gradient is applied. The temperature gradient shows the variation presented in FIG. 4.

As can be seen from the figures, the depolarization follows the variation of the temperature gradient. Shortly after turning the Peltier element on or off, the depolarization assumes an extreme value. As the applied temperature gradient decreases, so does the depolarization. According to the invention, we have found that this variation is independent of the orientation of the crystal relative to the laser direction. The effect is most pronounced, however, for the <110> crystal orientation in the beam direction and least pronounced for the <100> crystal orientation in the beam direction. Here the crystal axes in the cubic crystal are identical with the perpendiculars to the crystal planes in the reciprocal lattice coordinate system.

Figure 6A:
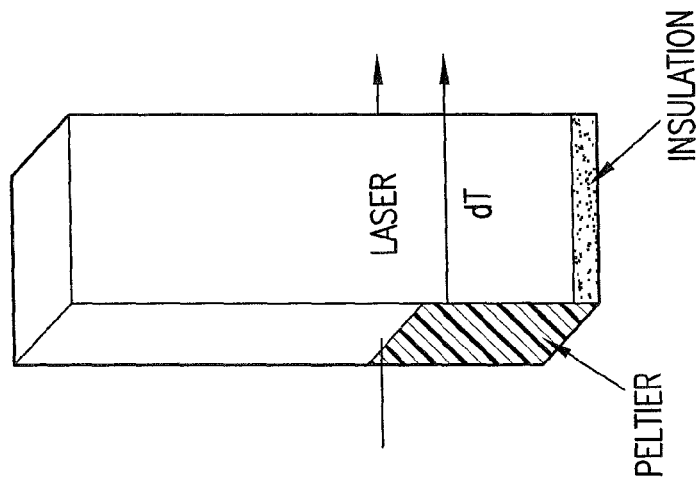
FIG. 6 shows an experimental arrangement for setting a temperature gradient perpendicular and parallel to the direction of the beam.
Figure 6B:
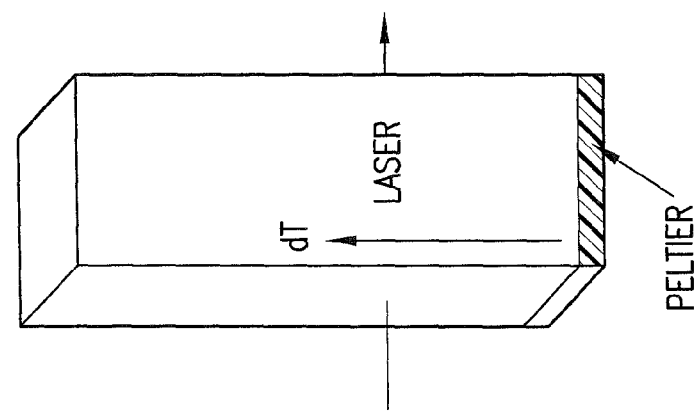
Figure 6C:
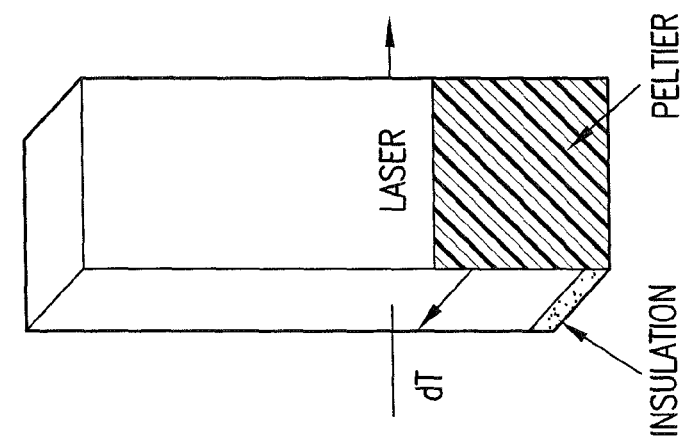

With the aid of the invention, we also studied how the depolarization is affected by the direction of the temperature gradient relative to the direction of the beam. The experimental set-up is shown in FIG. 6a-c where FIGS. 6a and 6b indicate the setting of a temperature gradient perpendicular to the direction of the beam and FIG. 6c indicates the setting parallel to it. When the temperature gradient and the direction of the beam are perpendicular to one another as shown in FIG. 5, strains arise in the direction of the beam. This is presented in FIGS. 3 and 6a and 6b. Such a temperature gradient brings about a short-lasting change in the degree of polarization as can be seen in FIGS. 5a-c and 7a. The temperature gradient that extends parallel to the direction of the beam (FIG. 6c) shows the effect indicated in FIG. 7b. The temperature gradients applied in the arrangements of FIGS. 6a-c amounted to 10° C./25 mm. As can be seen in FIG. 7, the direction of the temperature gradient exerts a strong effect on the depolarization. When the temperature gradient is perpendicular to the direction of the beam, only a short-lasting de-polarization ensues. When, however, the gradient extends parallel to the direction of the beam, a strong depolarization can be observed, particularly over the entire time period during which the temperature rise or temperature gradient is applied.

Figure 8:
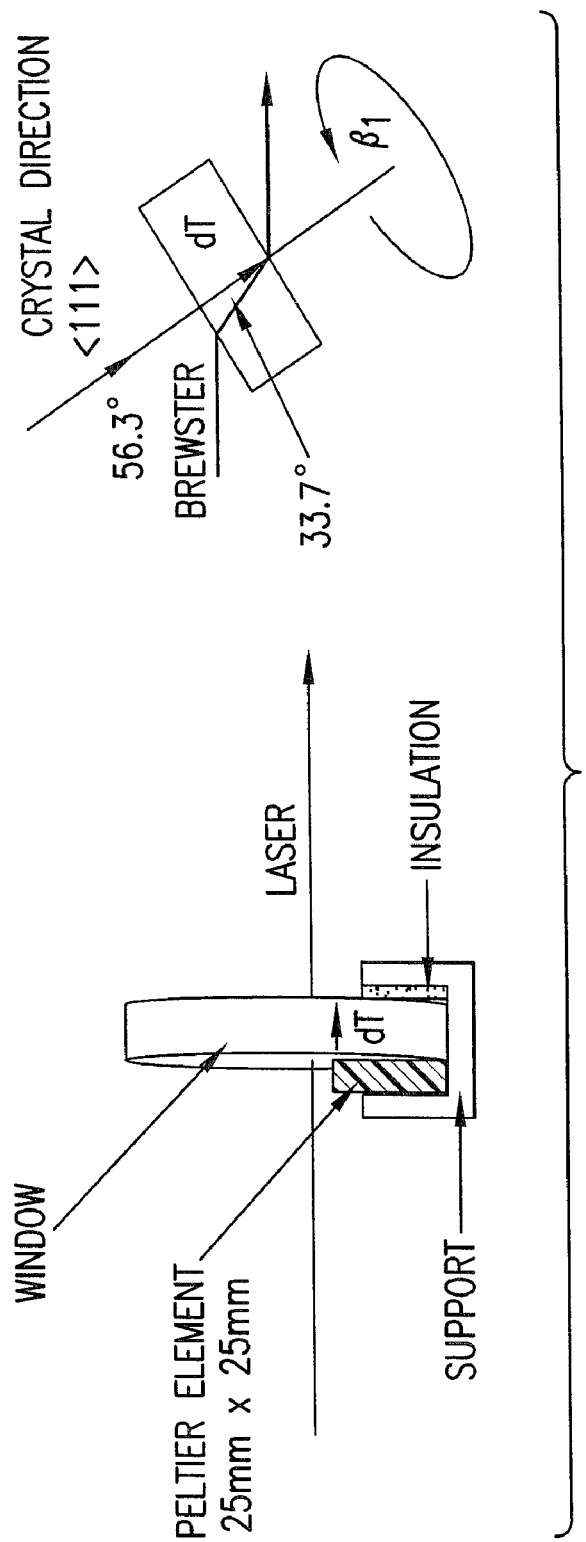
FIG. 8 shows an experimental arrangement for determining the effect of a temperature gradient on the depolarization at a laser window.

We also studied how the orientation of the temperature gradient relative to the direction of the beam affected the depolarization and particularly for an incidence angle at which the temperature gradient was composed of parts that are parallel and perpendicular to the direction of the beam (for example 45-75° C., and particularly the Brewster angle). For this purpose, the arrangement shown in FIGS. 8a and b was used. As shown in FIG. 8, a laser beam is directed to the {111} front surface at a Brewster angle of 56.3°. Here $\beta_1$ gives the orientation of the window or of the crystal in the support. Different temperature gradients were then applied at different $\beta_1$ angles along the direction of crystal irradiation. The results are shown in FIG. 9a-d.

With this arrangement, with the aid of the Peltier element, two different temperature gradients were applied over the crystal thickness (d=7 mm), namely 20° C./7 mm and 45° C./7 mm. As can be seen from FIG. 9, the depolarization varied markedly with the variation of the $\beta_1$ angle. It can thus be seen that the application of a temperature gradient at a $\beta_1$ angle of 270° (approximately corresponding to an irradiation along the <100> axis in the crystal) gives a negligibly small depolarization or a depolarization that falls within experimental error.

Figure 10:
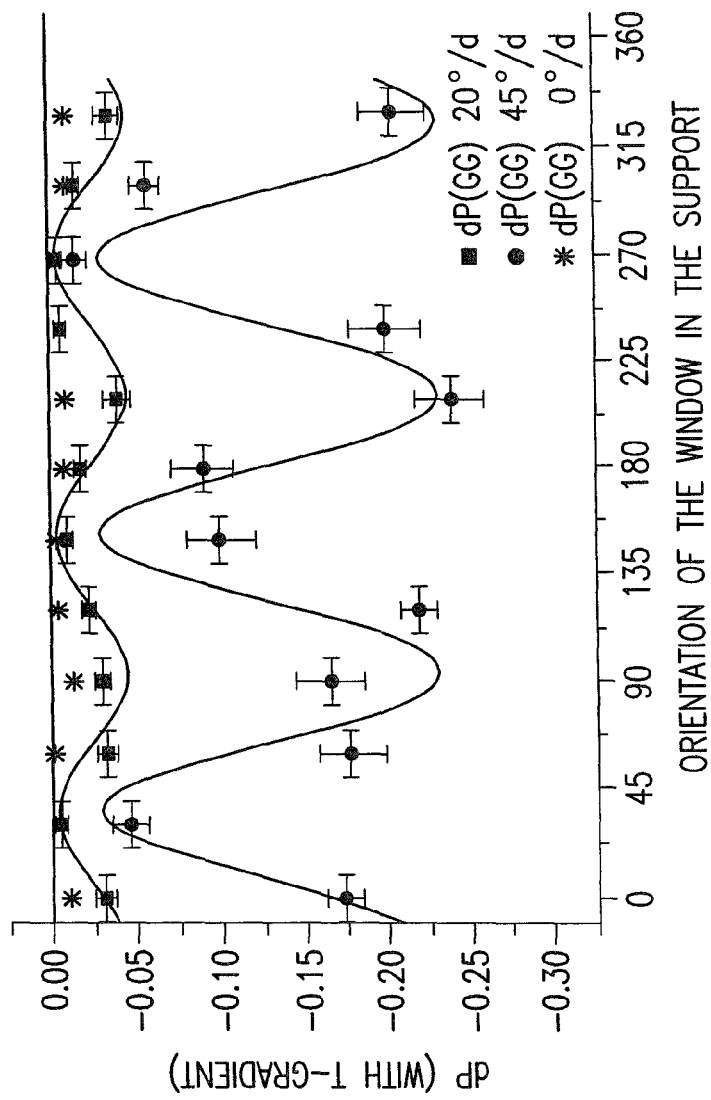
FIGS. 10 and 11 show the depolarization taking place through a window as a function of the angle $\beta_1$.
Figure 11:
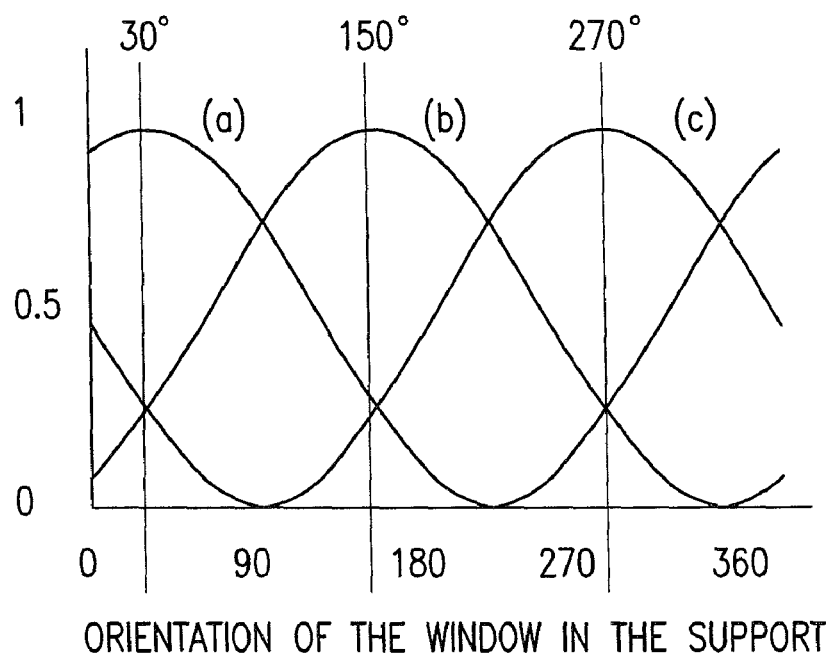

By turning the window in the support of FIG. 8 by $\beta_1$, the crystal orientation was changed to the direction of the beam. The result is shown in FIG. 10. This figure indicates the depolarization of the laser radiation which is transmitted through a <111>-oriented laser window at a Brewster angle relative to the perpendicular as a function of the angle $\beta_1$ when a temperature gradient is applied perpendicular to the front surfaces (along the <111> crystal axis). FIG. 11 shows the calculated projection of the direction of the laser beam in the laser window for an irradiation at a Brewster angle and the change in the $\beta_1$ angle. At 30°, 150° and 270°, the irradiation occurs approximately along the <100> crystal axis. This corresponds to the minima of depolarization in FIG. 10.

The method of the invention and the arrangement pertaining to it are suitable particularly for TFT panel displays and for optical components in DUV lithography as well as for the production of electronic devices. Hence, the invention also relates to lenses, prisms, light-conducting rods, optical windows and optical devices for DUV lithography, particularly steppers and excimer lasers and to the use thereof for the production of integrated circuits, computer chips and electronic devices as well as other devices that contain chip-like integrated circuits.

The invention claimed is:
1. An arrangement for generating linearly polarized light and for transmitting said linearly polarized light through a crystal so as to reduce or prevent depolarization of said linearly polarized light, said arrangement comprising:

a device for generating linearly polarized light;

a crystal having {111}- or {100}-crystal planes and <100>- or <111>-crystal axes; and optionally means for preventing formation of a temperature gradient in the crystal;

wherein said crystal has a surface that is one of the {111}- or {100}-crystal planes, and is oriented so that the linearly polarized light impinges on said surface at an incidence angle of 45 to 75° and after entering the crystal the linearly polarized light propagates through the crystal as parallel as possible to the <100>- or <111>-crystal axes;

whereby depolarization of said linearly polarized light passing through said crystal is reduced or prevented.

2. The arrangement as defined in claim 1, wherein said crystal is oriented so that said linearly polarized light impinges on said surface at a Brewster angle.

3. The arrangement as defined in claim 1, wherein said device for producing said linearly polarized light produces coherent light by stimulated emission, and said means for producing said linearly polarized light comprises a laser-active medium, an optical resonator cavity containing said laser-active medium and an energy pump for producing laser transition regions in said laser-active medium;

wherein said crystal is an exit window of the optical resonator cavity or is arranged within the optical resonator cavity as an additional optical element irradiated by the coherent light so that said surface onto which the coherent light impinges is said one of the {111}- or {100}- crystal planes and so that the coherent light propagates within the crystal as parallel as possible to the <100>- or <111>-crystal axes.

4. The arrangement as defined in claim 1, wherein said device for producing said linearly polarized light comprises a solid-state laser or a gas laser.

5. The arrangement as defined in claim 1, wherein said device for producing said linearly polarized light produces coherent light by stimulated emission; wherein said device for producing said linearly polarized light comprises a laser-active medium, an optical resonator cavity containing said laser-active medium and an energy pump for producing laser transition regions in said laser-active medium; wherein said crystal is an exit window of the optical resonator cavity or is arranged within the optical resonator cavity as an additional optical element irradiated by the coherent light; and further comprising said means for preventing formation of said temperature gradient in said crystal, said means for preventing formation of said temperature gradient comprising a tempering unit for said exit window or for said additional optical element irradiated by the coherent light, said tempering unit preventing formation of temperature gradients in a direction of a light path of the coherent light through said exit window or said additional optical element.

6. The arrangement as defined in claim 5, wherein said tempering unit prevents formation of respective temperature gradients in corresponding spatial directions in said crystal.

7. The arrangement as defined in claim 5, wherein said tempering unit comprises a heating system and/or a cooling system for said crystal.

8. The arrangement as defined in claim 5, wherein said tempering unit comprises a Peltier element, a tempered gas stream and/or a heat radiator.

9. The arrangement as defined in claim 5, wherein said tempering unit controls a temperature of at least one hottest spot of the crystal.

10. The arrangement as defined in claim 5, wherein said exit window or said additional optical element is arranged in relation to the coherent light, so as to be penetrated as centrally as possible by a laser beam comprising said coherent light.

11. The arrangement as defined in claim 3, wherein said exit window or said additional optical element is arranged in relation to the coherent light so as to be penetrated as centrally as possible by a laser beam comprising said coherent light.

12. The arrangement as defined in claim 1, wherein said crystal consists of a cubic crystalline material.

13. The arrangement as defined in claim 12, wherein the cubic crystalline material is at least one inorganic compound selected from the group consisting of $CaF_2$, $SrF_2$, $BaF_2$, $Y_2O_3$, $Y_3Al_5O_{12}$, $Lu_3Al_5O_{12}$, $MgAl_2O_4$, NaCl and $ZrO_2$:$Y_2O_3$ in which yttrium is in a stabilized cubic phase comprising $ZrO_2$.

14. A method of preventing and/or minimizing depolarization of linearly polarized light during transmission of the linearly polarized light through a crystal having {111}- or {100}-crystal planes and <100>- or <111>-crystal axes, said method comprising the steps of:

a) orienting said crystal in relation to a direction of propagation of said linearly polarized light so that a crystal surface onto which the linearly polarized light impinges is one of said {111}- or {100}-crystal planes and so that the linearly polarized light impinges on said one of said {111}- or {100}-crystal planes at an incidence angle of 45-75° and so that the direction of propagation of said linearly polarized light is as parallel as possible to the <100>- or <111>-crystal axes; and b) preventing formation of a temperature gradient in the crystal with a tempering unit.

15. The method as defined in claim 14, wherein said tempering unit comprises a heating system and/or a cooling system for said crystal.

16. The method as defined in claim 14, wherein said crystal consists of a crystalline material that is selected from the group consisting of $CaF_2$, $SrF_2$, $BaF_2$, $Y_2O_3$, $Y_3Al_5O_{12}$, $Lu_3Al_5O_{12}$, $MgAl_2O_4$, NaCl and $ZrO_2$:$Y_2O_3$ in which yttrium is in a stabilized cubic phase comprising $ZrO_2$.

17. The method as defined in claim 14, wherein the linearly polarized light impinges on said one of said {111}-crystal planes or said one of said {100}-crystal planes at a Brewster angle.

18. A stepper or excimer laser device for DUV lithography, comprising the arrangement as claimed in claim 1.

19. A process for making an integrated circuit or a computer chip or an electronic device, such as a computer, which contains said integrated circuit or said computer chip, or a flat-panel display device, by DUV lithography using a stepper or an excimer laser device, said stepper or said excimer laser device including the arrangement according to claim 1.

* * * * *

UNITED STATES PATENT AND TRADEMARK OFFICE
CERTIFICATE OF CORRECTION

PATENT NO. : 7,873,084 B2  Page 1 of 1
APPLICATION NO. : 11/874570
DATED : January 18, 2011
INVENTOR(S) : Natura et al.

It is certified that error appears in the above-identified patent and that said Letters Patent is hereby corrected as shown below:

On the Title Page

After Item (65) Add:

Domestic Application Priority Data

Provisional patent application Serial No. 60/853,581 filed October 23, 2006

Signed and Sealed this
Third Day of April, 2012

David J. Kappos
*Director of the United States Patent and Trademark Office*